(12) United States Patent
Kim

(10) Patent No.: US 9,214,227 B2
(45) Date of Patent: Dec. 15, 2015

(54) NONVOLATILE MEMORY DEVICE PERFORMING READ OPERATION USING REFERENCE CELL ARRAY AND SEMICONDUCTOR SYSTEM USING THE SAME

(71) Applicant: SK hynix Inc., Icheon-si Gyeonggi-do (KR)

(72) Inventor: Kyu Sung Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 161 days.

(21) Appl. No.: 14/042,833

(22) Filed: Oct. 1, 2013

(65) Prior Publication Data

US 2015/0036412 A1 Feb. 5, 2015

(30) Foreign Application Priority Data

Jul. 30, 2013 (KR) .................. 10-2013-0090016

(51) Int. Cl.
*G11C 11/00* (2006.01)
*G11C 13/00* (2006.01)
*G11C 11/56* (2006.01)

(52) U.S. Cl.
CPC .......... *G11C 13/004* (2013.01); *G11C 11/5685* (2013.01); *G11C 13/0023* (2013.01); *G11C 13/0069* (2013.01); *G11C 2013/0054* (2013.01); *G11C 2213/71* (2013.01); *G11C 2213/77* (2013.01)

(58) Field of Classification Search
CPC .......... G11C 13/0069; G11C 13/0004; G11C 13/0007
USPC ........ 365/230.03, 230.6, 189.07, 189.09, 148
See application file for complete search history.

(56) References Cited

U.S. PATENT DOCUMENTS

| 6,226,213 | B1 * | 5/2001 | Chih ........................ 365/210.13 |
| 6,646,930 | B2 * | 11/2003 | Takeuchi et al. ............... 365/200 |
| 7,020,037 | B2 * | 3/2006 | Anzai et al. ................ 365/210.1 |
| 8,045,355 | B2 * | 10/2011 | Ueda ............................... 365/51 |
| 2003/0002358 | A1 * | 1/2003 | Lee et al. ...................... 365/200 |
| 2003/0112664 | A1 * | 6/2003 | Yamano ................... 365/189.07 |
| 2010/0149894 | A1 * | 6/2010 | Mochida et al. .............. 365/200 |

FOREIGN PATENT DOCUMENTS

| KR | 1020040041069 A | 5/2004 |
| KR | 1020090006631 A | 1/2009 |

* cited by examiner

*Primary Examiner* — Connie Yoha
(74) *Attorney, Agent, or Firm* — William Park & Associates Ltd.

(57) ABSTRACT

Provided is a nonvolatile memory device including a resistive memory cell and semiconductor system using the same that is capable of setting the reference resistance value using resistance values of a plurality of memory cells. The nonvolatile memory device comprises one or more column lines, two or more row lines, a plurality of memory cells configured to be connected to the column lines and each of the row lines, and a reference resistance setting unit configured to enable a subset or all of the column lines and row lines and to set a reference resistance value.

16 Claims, 7 Drawing Sheets

FIG.4

| REFERENCE RESISTANCE | CL1 | CL2 | RL1 | RL2 | RL3 |
|---|---|---|---|---|---|
| R/4 | ON | ON | ON | ON | ON |
| R/3 | ON | ON | ON | ON | OFF |
| R/2 | ON | ON | OFF | ON | OFF |
| R | ON | OFF | ON | OFF | OFF |

US 9,214,227 B2

NONVOLATILE MEMORY DEVICE PERFORMING READ OPERATION USING REFERENCE CELL ARRAY AND SEMICONDUCTOR SYSTEM USING THE SAME

CROSS-REFERENCES TO RELATED APPLICATION

The present application claims priority under 35 U.S.C. §119(a) to Korean application number 10-2013-0090016, which was filed on Jul. 30, 2013, in the Korean Intellectual Property Office, which is incorporated herein by reference in its entirety.

BACKGROUND

1. Technical Field

Various embodiments relate to a semiconductor device, and more particularly, to a nonvolatile memory device that includes a resistive memory cell, and to a semiconductor system using the same.

2. Related Art

Dynamic random access memory (DRAM) stores data by charging and discharging a memory cell comprising a capacitor. DRAM is volatile memory because leakage current flows out of the capacitor. Various research has been conducted with the goal of realizing a memory device that is nonvolatile and thus obviates the need for separate data storage. Particularly, there are ongoing efforts to realize non-volatility by changing the material of the memory cell, one ongoing effort of which is to realize a memory device that includes a resistive memory cell.

The resistive memory device includes a memory cell made of variable resistive material, where the memory cells variable resistance depends on the amount of current running through the material. Thus we can store data in the memory cell by changing the amount of current flowing into a resistive memory cell. For example, a memory cell exhibiting high resistance may have data '0' and a memory cell exhibiting low resistance may have data '1'.

FIG. 1 is a graph illustrating a resistance distribution of a multi-level cell.

The variable resistive material may have 3 or more states of resistance, which makes the memory cell capable of storing multi-level data. As illustrated in FIG. 1, a multi-level cell may have 4 resistance distributions and store 2 bits of data, each of whose values has a corresponding unique logic value based on the resistance distributions.

For example, data distributed in a range over a resistance value of R/2 may represent the logic value '11'. Data distributed in a range between resistance values of R/2 and R/3 may represent the logic value '10'. Data distributed in a range between resistance values of R/3 and R/4 may represent the logic value '01'. Data distributed in a range under a resistance value of R/4 may represent the logic value '00'.

It is important that a resistive memory device having a multi-level cell accurately read and write data based on the resistance distributions. In the case of 4 resistance distributions, as illustrated in FIG. 1, 3 or more reference currents or voltages are needed to accurately detect data stored in the memory cell. A resistive memory device may include a reference cell for generating the reference current or voltage. The resistive memory device keeps changing the resistive status of the reference cell and generates the reference current or voltage in order to read the data stored in the memory cell.

SUMMARY

A nonvolatile memory device capable of setting a reference resistance value using resistance values of a plurality of memory cells is described herein.

In an embodiment of the present invention, a nonvolatile memory device comprises one or more column lines, two or more row lines, a plurality of memory cells configured to be connected to the column lines and each of the row lines, and a reference resistance setting unit configured to enable a subset or all of the column lines and row line to set a reference resistance value.

In an embodiment of the present invention, a nonvolatile memory device comprises a plurality of column lines, a plurality of row lines, a memory cell array configured to include a plurality of memory cells, each of which is disposed at a cross-point of a column line and a row line, a column decoding unit configured to select one of the column lines to be accessed, a row decoding unit configured to select one of the row lines to be accessed, and a reference resistance setting unit configured to select a subset of the column lines and a subset of the row lines to set a reference resistance value.

In an embodiment of the present invention, a nonvolatile memory device comprises a memory cell array configured to include a plurality of sub-arrays, each of which includes a normal cell array and a reference cell array, and a reference resistance setting unit configured to select a subset or all of the column lines and row lines disposed in a reference cell array in order to set a reference resistance value.

BRIEF DESCRIPTION OF THE DRAWINGS

Features, aspects, and embodiments are described in conjunction with the attached drawings, in which:

FIG. 4 is a table illustrating reference resistance values according to a resistance setting signal;

DETAILED DESCRIPTION

Hereinafter, a nonvolatile memory device and a semiconductor system using the same according to the present invention will be described below with reference to the accompanying drawings through example embodiments.

Figure 1:
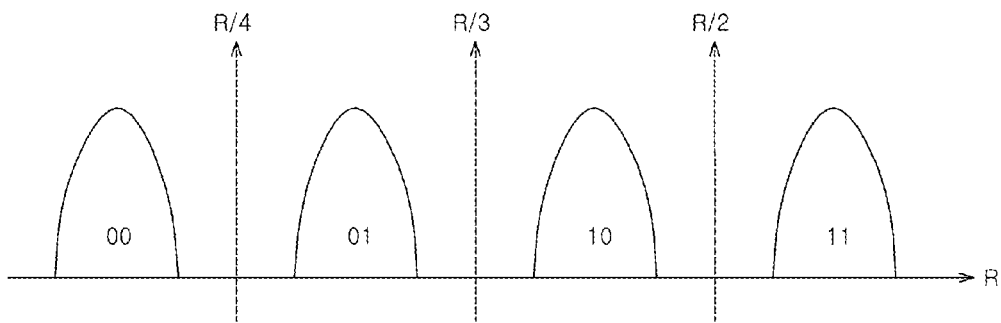
FIG. 1 is a graph illustrating resistance distributions of a multi-level cell.
Figure 2:
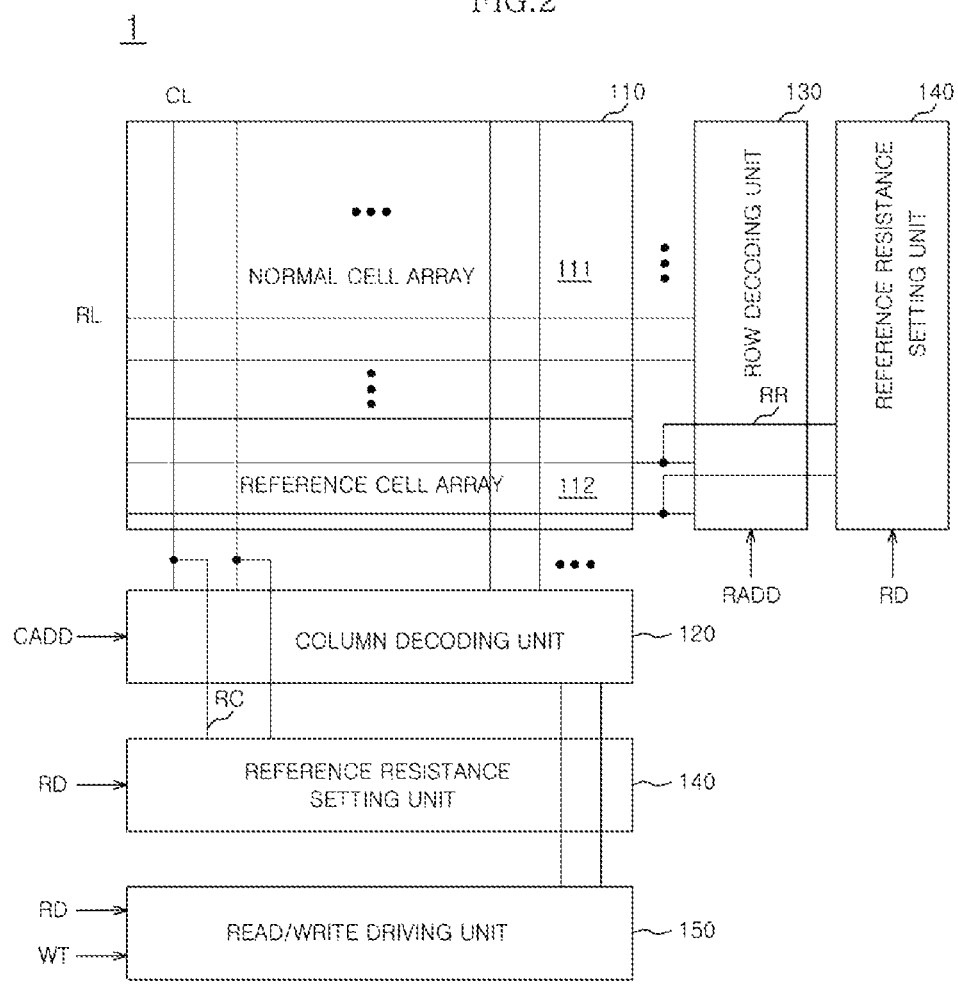
FIG. 2 is a block diagram illustrating a nonvolatile memory device according to an embodiment of the present invention.

Referring to FIG. 2, a nonvolatile memory device 1 may comprise a memory cell array 110, a column decoding unit 120, a row decoding unit 130, and a reference resistance setting unit 140.

The memory cell array 110 may include a plurality of column lines CL and a plurality of row lines RL disposed to cross the column lines CL. Each of the memory cells comprised of the resistive material may be disposed at a cross-point of a column line CL and a row line RL (not illustrated). Memory cells comprised of the resistive material may have various resistance values which vary according to a write operation.

The memory cell array 110 may include a normal cell array 111 and a reference cell array 112. The functions of the normal cell array 111 and the reference cell array 112 are different. The normal cell array 111 may store data, and the reference cell array 112 may be used for read operations associated with the normal cell array 111. The reference cell array 112 may provide the reference resistance value to be compared with reference values calculated when performing operations associated with of the normal cell array 111. FIG. 2 defines a disposition of the normal cell array 111 and the reference cell array 112 in the memory cell array 110. The disposition of the cell arrays 111, 112 may vary according to the device design.

The column decoding unit 120 may select one of the column lines CL to be accessed. The column decoding unit 120 may select one of the column lines CL to be accessed in response to a column address signal CADD. The row decoding unit 130 may select one of the row lines RL to be accessed. The row decoding unit 130 may select one of the row lines RL to be accessed in response to a row address signal RADD. A memory cell may be accessed at the cross point of a column line and a row line. The column line and row line may be respectively selected by the column decoding unit 120 and the row decoding unit 130.

The reference resistance setting unit 140 may select one of the memory cells in the reference cell array 112. While reading the nonvolatile memory device 1, the reference resistance setting unit 140 may select a column line CL and a row line RL disposed in the reference cell array 112 to provide a reference resistance value. The reference resistance setting unit 140 may, in one embodiment, select one or more column lines CL and two or more row lines RL. The reference resistance setting unit 140 may select a subset or all of the column lines CL and row lines RL disposed in the reference cell array 112. Thus, the reference resistance setting unit 140 may select one or more memory cells in the reference cell array 112, the resistances of which may form the reference resistance value. As disclosed below, the reference resistance setting unit 140 may generate a column resistance setting signal RC and a row resistance setting signal RR to set the reference resistance value.

As illustrated in FIG. 2, the nonvolatile memory device 1 may further include a read/write driving unit 150. The read/write driving unit 150 may provide a read current and/or a read voltage in response to a read command RD associated with a read operation of the nonvolatile memory device 1, and a write current and/or a write voltage in response to a write command WT associated with a write operation to the nonvolatile memory device 1. The read current, the read voltage, the write current and the write voltage are forwarded by the column decoding unit 120 to the selected column line CL so that data may be read from or stored to a selected memory cell.

During the read operation, the reference resistance setting unit 140 may set the reference resistance value in response to the read command RD. The reference resistance setting unit 140 during the read operation may set the reference resistance value by selecting a subset or all of the column lines CL and row lines RL disposed in the reference cell array 112. The read/write driving unit 150 may provide the read current and/or the read voltage for a column line CL to which a memory cell being accessed is connected, and may receive a current and/or voltage that may vary according to the resistance value of the memory cell being accessed. The read/write driving unit 150 may compare the received current and/or voltage with a current and/or voltage according to the reference resistance value to detect the data stored in the memory cell being accessed.

Figure 3:
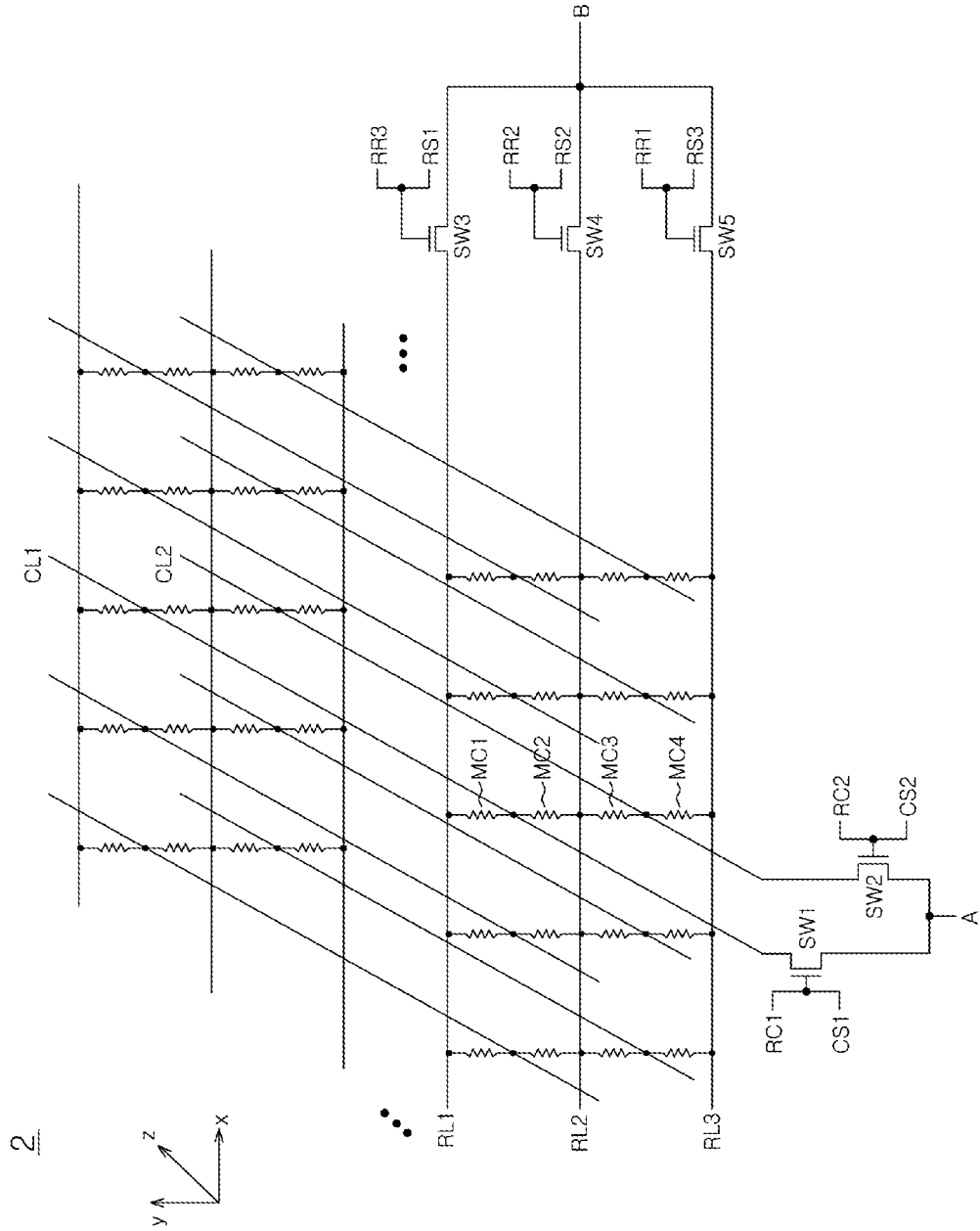
FIG. 3 is a detailed block diagram illustrating a memory cell array according to an embodiment of the present invention.

FIG. 3 is a detailed block diagram illustrating a memory cell array 2 according to an embodiment of the present invention. The memory cell array 2 may comprises the normal cell array 111 and the reference cell array 112, and further comprises a plurality of switches to select the row lines and column lines.

In FIG. 3, the reference cell array 112 may comprise first and second column lines CL1 and CL2 and first to third row lines RL1 to RL3, as illustrated in FIG. 3. Although FIG. 3 depicts two column lines CL1 and CL2 and three row lines RL1 to RL3, in other embodiments the reference cell array 112 may include fewer or more row and/or column lines. A first memory cell MC1 may be connected between the first column line CL1 and the first row line RL1. A second memory cell MC2 may be connected between the first column line CL1 and the second row line RL2. A third memory cell MC3 may be connected between the second column line CL2 and the second row line RL2. A fourth memory cell MC4 may be connected between the second column line CL2 and the third row line RL3.

The reference resistance setting unit 140 may set the reference resistance value by selecting a subset or all of the first and second column lines CL1 and CL2 and the first to third row lines RL1 to RL3. The reference resistance setting unit 140 may generate first and second column resistance setting signals RC1 and RC2 and first to third row resistance setting signals RR1 to RR3 to select the first and second column lines CL1 and CL2 and the first to third row lines RL1 to RL3. Each of the first and second column lines CL1 and CL2 and the first to third row lines RL1 to RL3 disposed in the reference cell array 112 may include a switch for receiving the column resistance setting signals RC1 and RC2 and row resistance setting signals RR1 to RR3.

As illustrated in FIG. 3, the first column line CL1 may include a first switch SW1 for receiving the first column resistance setting signal RC1. The second column line CL2 may include a second switch SW2 for receiving the second column resistance setting signal RC2. The first row line RL1 may include a third switch SW3 for receiving the first row resistance setting signal RR1. The second row line RL2 may include a fourth switch SW4 for receiving the second row resistance setting signal RR2. The third row line RL3 may include a fifth switch SW5 for receiving the third row resistance setting signal RR3.

Each of the first and second switches SW1 and SW2 may receive first and second column selection signals CS1 and CS2 with the first and second column lines CL1 and CL2. The column decoding unit 120 may generate the first and second column selection signals CS1 and CS2. The first and second column selection signals CS1 and CS2 may be used for selecting a memory cell disposed in the normal cell array 111, among the memory cells connected to the first and second column lines CL1 and CL2. Thus, in one example, each subset of the column lines CL1 and CL2 includes at least one switch SW1 and SW2 configured to be turned on in response to a corresponding column resistance setting signal RC1 and RC2 and a column selection signal CS1 and CS2 generated by the column decoding unit 120.

Each of the third to fifth switches SW3 to SW5 may receive first to third row selection signals RS1 to RS3 with the first to third row lines RL1 to RL3. The row decoding unit 130 may generate the first to third row selection signals RS1 to RS3.

The first to third row selection signals RS1 to RS3 may be used for selecting a memory cell disposed in the normal cell array 111, among the memory cells connected to the first to third row lines RL1 to RL3. Thus, in one example, each subset of the row lines RL1 to RL3 includes a switch SW3 to SW5 configured to be turned on in response to a corresponding row resistance setting signal RR1 to RR3 and a row selection signal RS1 to RS3 generated by the row decoding unit 130.

The reference resistance setting unit 140 may set the reference resistance value by combining the resistance value of selected memory cells in the reference cell array 112. The initial resistance value of each of the memory cells may be set when the memory cell is fabricated. The reference resistance setting unit 140 may set the reference resistance value by combining the initial resistance value of selected memory cells of the reference cell array 112.

The first and second column lines CL1 and CL2 disposed in the reference cell array 112 may be connected to each other via a metal line. The first to third row lines RL1 to RL3 disposed in the reference cell array 112 may be connected to one another via a metal line. It is preferable that connections between the first and second column lines CL1 and CL2 and the first to third row lines RL1 to RL3 are formed in a peripheral area outside the memory cell array 110.

FIG. 4 is a table illustrating the reference resistance values according to the resistance setting signal.

The letter "R" in the table denotes a resistance value of a memory cell included in the reference cell array 112. When the reference resistance setting unit 140 selects all of the first and second column lines CL1 and CL2 and the first to third row lines RL1 to RL3, between a node A and a node B (see, FIG. 3), the first and second memory cells MC1 and MC2 are connected to each other in parallel and the third and fourth memory cells MC3 and MC4 are connected to each other in parallel. The reference resistance value may be set to R/4 due to the parallel connection of the first to fourth memory cells MC1 to MC4. Thus, the reference resistance value may equal a sum of the initial resistance values of the first to fourth memory cells MC1 to MC4.

When the reference resistance setting unit 140 selects the first and second column lines CL1 and CL2 and the first and second row lines RL1 and RL2, between the node A and the node B, the first to third memory cells MC1 to MC3 are connected to each other in parallel. The reference resistance value may be set to R/3 due to the parallel connection of the first to third memory cells MC1 to MC3. Thus, the reference resistance value may equal a sum of the initial resistance values of the first to third memory cells MC1 to MC3.

When the reference resistance setting unit 140 selects the first and second column lines CL1 and CL2 and the second row line RL2, between the node A and the node B, the second and third memory cells MC2 and MC3 are connected to each other in parallel. The reference resistance value may be set to R/2 due to the parallel connection of the second and third memory cells MC2 and MC3. Thus, the reference resistance value may equal a sum of the initial resistance values of the second and third memory cells MC2 and MC3.

When the reference resistance setting unit 140 selects the first column line CL1 and the first row line RL1, the reference resistance value may be set to R due to the first memory cell MC1 between the node A and the node B. Thus, the reference resistance value may equal the initial resistance value of the first cell MC1. The reference cell array 112 may provide various reference resistance values for the reference resistance setting unit 140 in order to read multi-level data from memory cells of the normal array 111.

Figure 5:
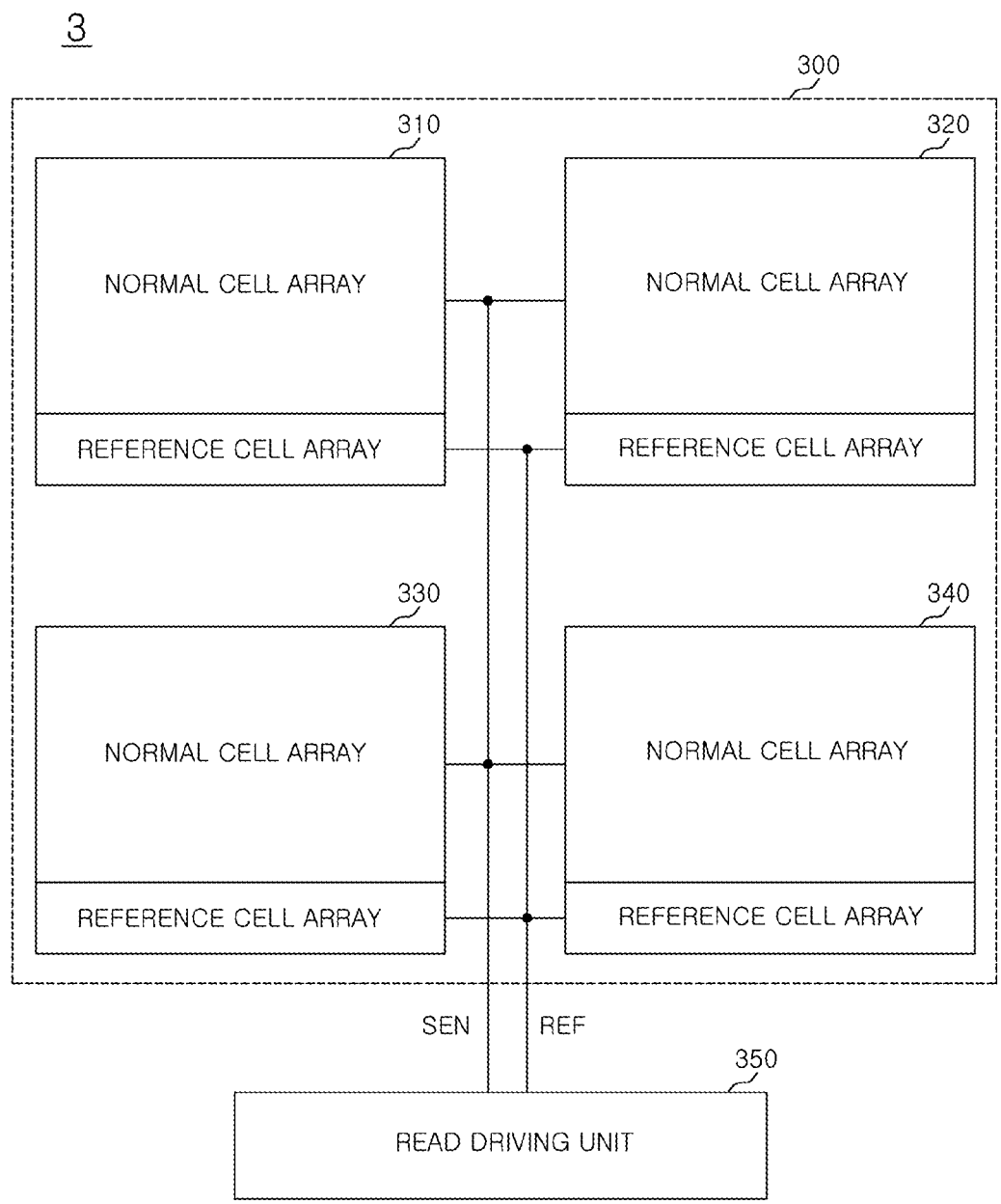
FIG. 5 is a block diagram illustrating a nonvolatile memory device according to an embodiment of the present invention.

FIG. 5 is a block diagram illustrating a nonvolatile memory device according to an embodiment of the present invention.

Referring to FIG. 5, the nonvolatile memory device 3 may comprise a memory cell array 300. The memory cell array 300 may include a plurality of sub-arrays. The memory cell array 300 illustrated in FIG. 5 includes first to fourth sub-arrays 310, 320, 330 and 340. The number of sub-arrays may vary according to the device design. Each of the sub-arrays 310 to 340 may include a normal cell array and a reference cell array. The reference cell array may be disposed at an edge of each of the sub-arrays 310 to 340.

When a memory cell is accessed to read data in the normal cell array of the first sub-array 310, the reference resistance setting unit 140 may provide the reference resistance value based on the reference cell array of the first sub-array 310. Similarly, when a memory cell is accessed in order to read data in the normal cell array of one of the second to fourth sub-arrays 320 to 340, the reference resistance setting unit 140 may provide the reference resistance value based on the reference cell array of the corresponding sub-array.

The nonvolatile memory device 3 may perform a read operation using a reference cell array adjacent to the memory cell to be accessed in order to make the output paths of the read current and/or voltage SEN and the reference current and/or voltage REF substantially identical. Thus the nonvolatile memory device 3 is capable of reducing mismatch between the read current and/or voltage SEN and the reference current and/or voltage REF. Thus, the nonvolatile memory device 3 may be capable of raising the accuracy of read operations.

The nonvolatile memory device 3 may further include a read driving unit 350. The read driving unit 350 may compare the read current and/or voltage SEN flowing through a selected memory cell, with the reference current and/or voltage REF according to the reference resistance value set by the reference resistance setting unit 140 in order to detect data stored in a memory cell being accessed.

Figure 6:
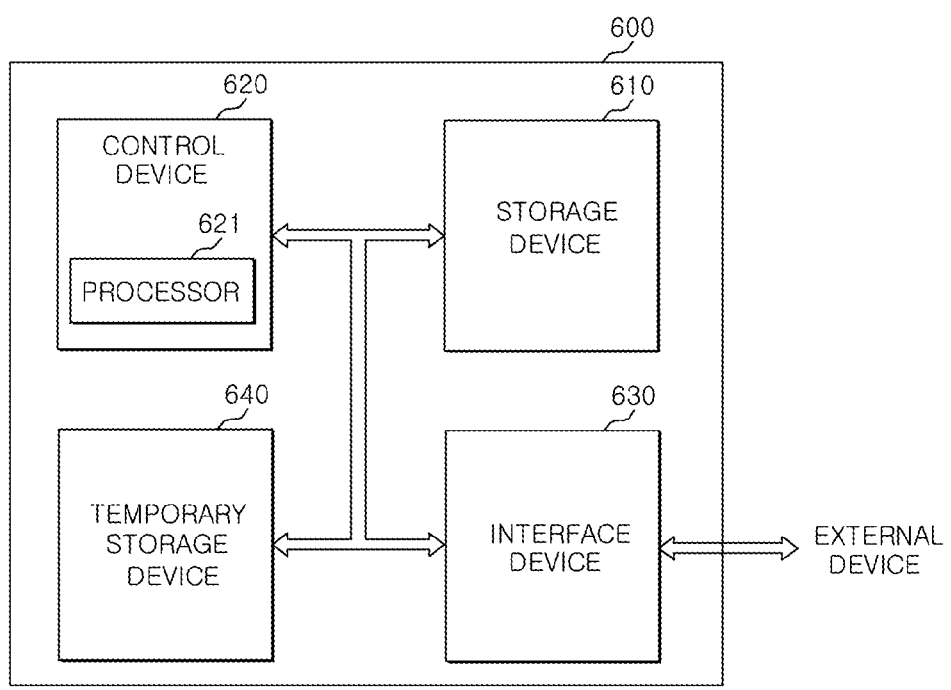
FIG. 6 is a block diagram illustrating a data storage system according to an embodiment of the present invention.

FIG. 6 is a block diagram illustrating a data storage system according to an embodiment of the present invention.

Referring to FIG. 6, the data storage system 600 may comprise a storage device 610 that may be nonvolatile, a control device 620 that controls the storage device 610, and an interface device 630 that connects an external device to the data storage system 600. The data storage system 600 may be of a disk type, such as a hard disk drive (HDD), a compact disc read only memory (CDROM), a digital versatile disc (DVD), and a solid state disk (SSD). The data storage system 600 may be of a card type, such as a universal serial bus (USB) memory, a secure digital (SD) card, a mini secure digital card (mSD), a micro SD, a secure digital high capacity (SDHC) card, a memory stick card, a smart media card (SM), a multimedia card (MMC), an embedded MMC (eMMC), and a compact flash (CF) card.

The control device 620 may control data communication between the storage device 610 and the interface device 630. The control device 620 may include a processor 621 for calculating and processing commands input from the external device through the interface device 630.

The interface device 630 may be used for data communication between the data storage system 600 and the external device. If the data storage system 600 is of a card type, the interface device 630 may be compatible with the universal serial bus (USB) memory, the secure digital (SD) card, the mini secure digital card (mSD), the micro SD, the secure digital high capacity (SDHC) card, the memory stick card, the smart media card (SM), the multimedia card (MMC), the embedded MMC (eMMC), or the compact flash (CF) card. If the data storage system 600 is of a disk type, the interface device 630 may be compatible with Integrated Device Electronics (IDE), Serial Advanced Technology Attachment (SATA), Small Computer System Interface (SCSI), External SATA (eSATA), Personal Computer Memory Card International Association (PCMCIA), or Universal Serial Bus (USB) interfaces.

The data storage system 600 may further comprise a temporary storage device 640 for effective data transfer between the storage device 610 and the interface device 630. The storage device 610 and the temporary storage device 640 may include the nonvolatile memory device according to embodiments disclosed above.

Figure 7:
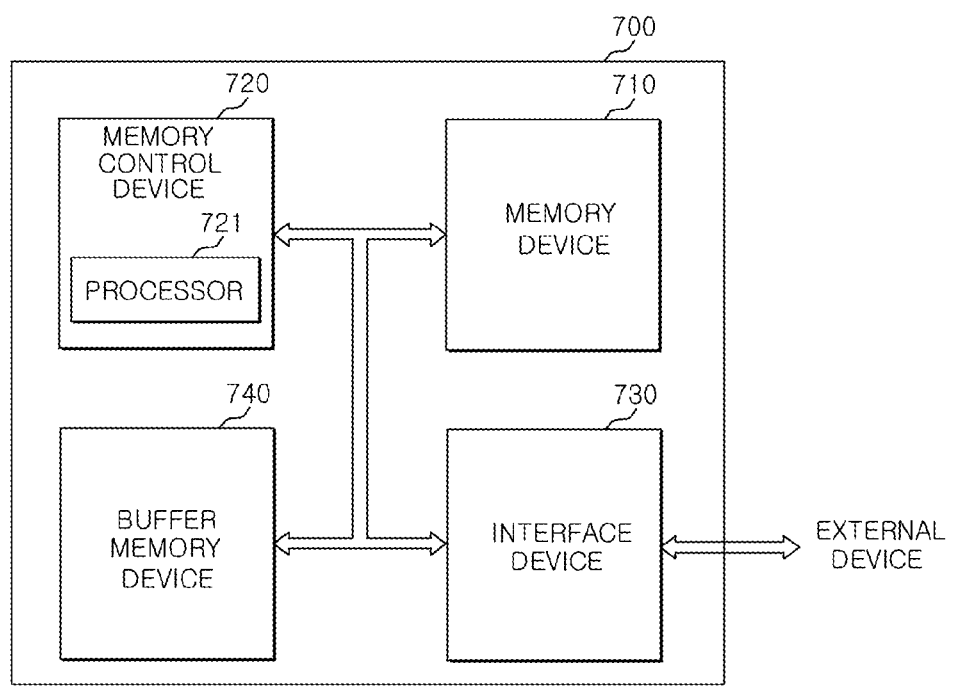
FIG. 7 is a block diagram illustrating a memory system according to an embodiment of the present invention.

FIG. 7 is a block diagram illustrating a memory system according to an embodiment of the present invention.

Referring to FIG. 7, the memory system 700 may comprise a memory device 710 that may be nonvolatile, a memory control device 720 controlling the memory device 710, and an interface device 730 connecting an external device to the memory system 700. The memory system 700 may be of a card type, such as the solid state disk (SSD), the universal serial bus (USB) memory, the secure digital (SD) card, the mini secure digital card (mSD), the micro SD, the secure digital high capacity (SDHC) card, the memory stick card, the smart media card (SM), the multimedia card (MMC), the embedded MMC (eMMC), and the compact flash (CF) card. The memory device 710 may include the nonvolatile memory device according to embodiments disclosed above.

The memory control device 720 may control data communication between the memory device 710 and the interface device 730. The memory control device 720 may include a processor 721 for calculating and processing commands input from the external device through the interface device 730.

The interface device 730 may be used for data communication between the memory system 700 and the external device. The interface device 730 may be compatible with the universal serial bus (USB) memory, the secure digital (SD) card, the mini secure digital card (mSD), the micro SD, the secure digital high capacity (SDHC) card, the memory stick card, the smart media card (SM), the multimedia card (MMC), the embedded MMC (eMMC), and the compact flash (CF) card.

The memory system 700 may further comprise a buffer memory device 740 for effective data transfer between the memory device 710 and the interface device 730. The buffer memory device 740 may include the nonvolatile memory device according to embodiments disclosed above.

While certain embodiments have been described above, it will be understood by those skilled in the art that the embodiments described are by way of example only. Accordingly, the device and system described herein should not be limited based on the described embodiments. Rather, the device and system described herein should only be limited in light of the claims that follow when taken in conjunction with the above description and accompanying drawings.

What is claimed is:

1. A nonvolatile memory device comprising:
one or more column lines;
two or more row lines;
a plurality of memory cells configured to be connected to the column lines and each of the row lines; and
a reference resistance setting unit configured to enable a subset or all of the column lines and row lines to combine resistance values of at least two selected memory cells, and to set a reference resistance value.

2. The nonvolatile memory device of claim 1, wherein the reference resistance setting unit generates column resistance setting signals corresponding to respective column lines and row resistance setting signals corresponding to respective row lines, each of the column resistance setting signals enabling a corresponding column line and each of the row resistance setting signals enabling a corresponding row line.

3. The nonvolatile memory device of claim 2, wherein each of the column lines includes a switch configured to be turned on in response to one of the corresponding column resistance setting signals and a column selection signal.

4. The nonvolatile memory device of claim 2, wherein each of the row lines includes a switch configured to be turned on in response to one of the corresponding row resistance setting signals and a row selection signal.

5. A nonvolatile memory device comprising:
a plurality of column lines;
a plurality of row lines;
a memory cell array configured to include a plurality of memory cells, each of which is disposed at a cross-point of a column line and a row line;
a column decoding unit configured to select one of the column lines to be accessed;
a row decoding unit configured to select one of the row lines to be accessed; and
a reference resistance setting unit configured to select a subset of the column lines and a subset of the row lines to combine resistance values of at least two selected memory cells, and to set a reference resistance value.

6. The nonvolatile memory device of claim 5, wherein the reference resistance setting unit generates a plurality of column resistance setting signals corresponding to the subset of the column lines and a plurality of row resistance setting signals corresponding to the subset of the row lines to select the subset of the column lines and the subset of the row lines in response to a read command.

7. The nonvolatile memory device of claim 6, wherein each subset of the column lines includes at least one switch configured to be turned on in response to the corresponding column resistance setting signal and a column selection signal generated by the column decoding unit.

8. The nonvolatile memory device of claim 6, wherein each subset of the row lines includes a switch configured to be turned on in response to the corresponding row resistance setting signal and a row selection signal generated by the row decoding unit.

9. The nonvolatile memory device of claim 5, wherein the nonvolatile memory device during a read operation compares a read current or voltage flowing through a selected memory cell with a reference current or voltage according to the reference resistance value set by the reference resistance setting unit, the selected memory cell being accessed by the column decoding unit and the row decoding unit.

10. The nonvolatile memory device of claim 5, wherein the reference resistance setting unit selects the subset of the column lines and the subset of the row lines and sets the reference resistance value based on a resistance value of a memory cell connected to the selected subset of the column lines and the selected subset of the column lines.

11. The nonvolatile memory device of claim 5, wherein each of the subset of the column lines is electrically connected to another one of the subset of the column lines via a metal line.

12. The nonvolatile memory device of claim 5, wherein each of the subset of the row lines is electrically connected to another subset of the row lines via a metal line.

13. A nonvolatile memory device comprising:
- a memory cell array configured to include a plurality of sub-arrays, each of which includes a normal cell array and a reference cell array; and
- a reference resistance setting unit configured to select a subset or all column lines and row lines disposed in a reference cell array to combine resistance values of at least two selected memory cells, and to set a reference resistance value.

14. The nonvolatile memory device of claim 13, wherein the reference resistance setting unit selects the subset or all of the column lines and the row lines disposed in the reference cell array of the sub-array where a memory cell to be accessed is disposed, and sets the reference resistance value.

15. The nonvolatile memory device of claim 13, further comprising:
- a column decoding unit configured to select one of the column lines disposed in a normal cell array;
- a row decoding unit configured to select one of the row lines disposed in the normal array, wherein the selected column line and row line are for a memory cell to be accessed.

16. The nonvolatile memory device of claim 15, further comprising a read driving unit configured to compare a read current or voltage flowing through the accessed memory cell with a reference current or voltage according to the reference resistance value, and to perform a read operation.

* * * * *